United States Patent
Yoshiyama

(10) Patent No.: US 12,095,435 B2
(45) Date of Patent: Sep. 17, 2024

(54) HIGH FREQUENCY VARIABLE ATTENUATION CIRCUIT

(71) Applicant: Fujikura Ltd., Tokyo (JP)

(72) Inventor: Masayuki Yoshiyama, Sakura (JP)

(73) Assignee: FUJIKURA LTD., Tokyo (JP)

( * ) Notice: Subject to any disclaimer, the term of this patent is extended or adjusted under 35 U.S.C. 154(b) by 21 days.

(21) Appl. No.: 18/101,306

(22) Filed: Jan. 25, 2023

(65) Prior Publication Data

US 2023/0402997 A1  Dec. 14, 2023

(30) Foreign Application Priority Data

Jun. 13, 2022 (JP) ................... 2022-094968

(51) Int. Cl.
*H03H 11/24* (2006.01)
(52) U.S. Cl.
CPC ................... *H03H 11/24* (2013.01)
(58) Field of Classification Search
None
See application file for complete search history.

(56) References Cited

U.S. PATENT DOCUMENTS

| 5,049,841 A * | 9/1991 | Cooper | H03H 11/245 333/81 R |
| 8,674,746 B1 * | 3/2014 | Staudinger | H03F 1/3258 327/333 |
| 11,451,208 B2 * | 9/2022 | Kawasaki | H03K 17/693 |

| 2008/0036536 A1 | 2/2008 | Khorramabadi |
| 2009/0021331 A1 | 1/2009 | Dwang et al. |
| 2014/0002214 A1 | 1/2014 | Bawell et al. |
| 2018/0054178 A1 | 2/2018 | Bergsma |

FOREIGN PATENT DOCUMENTS

| CN | 113346870 A | 9/2021 |
| JP | 50-99059 A | 8/1975 |
| JP | H9-261060 A | 10/1997 |
| JP | 2000-188524 A | 7/2000 |
| JP | 2001-7672 A | 1/2001 |
| JP | 2002-246911 A | 8/2002 |
| JP | 2006-173868 A | 6/2006 |
| JP | 2008-206129 A | 9/2008 |
| JP | 2014-96725 A | 5/2014 |
| JP | 2016-171301 A | 9/2016 |

OTHER PUBLICATIONS

Xiao Haohao et al: "A DC-6 GHz 7-Bit Digital Attenuator with Low Insertion Loss", IEEE 4th International Conference on Electronics Technology, May 2021 (May 2021), pp. 95-98, XP033924640, (retrieved on Jun. 9, 2021); Cited in EP Search Report dated Nov. 7, 2023. (4 pages).

* cited by examiner

*Primary Examiner* — Jeffrey S Zweizig
(74) *Attorney, Agent, or Firm* — WHDA, LLP

(57) ABSTRACT

A high frequency variable attenuation circuit includes an input terminal, an output terminal, a first resistor, a second resistor, a third resistor, and a first switching circuit. The first switching circuit has an output side resistor and an output side switching element that are connected in series to each other. The first switching circuit has a first circuit end connected to the second end of the second resistor and the output terminal, and a second circuit end connected to the ground.

6 Claims, 2 Drawing Sheets

HIGH FREQUENCY VARIABLE ATTENUATION CIRCUIT

CROSS-REFERENCE TO RELATED APPLICATION

Priority is claimed on Japanese Patent Application No. 2022-094968, filed Jun. 13, 2022, the content of which is incorporated herein by reference.

BACKGROUND OF THE INVENTION

Field of the Invention

The present invention relates to a high frequency variable attenuation circuit.

Description of Related Art

Conventionally, as shown in Japanese Unexamined Patent Application, First Publication No. 2006-173868, a variable attenuation circuit is known as an important basic function circuit of a high frequency analog circuit in radio communication devices and the like. The variable attenuation circuit is a circuit that compensates as well as adjusts variations and the like in the level of a received signal, so that a desired level is obtained. In general, in a circuit configuration of a variable attenuation circuit for a high frequency signal, topology of a π-type attenuator (attenuation circuit) in which impedance matching is easily obtained is adopted. As such a circuit configuration, a circuit constituted by a resistor and a switching element is used. Such a circuit is adopted as each of an input side circuit and an output side circuit.

SUMMARY OF THE INVENTION

In the variable attenuation circuit, as a number of selection variations of the attenuation amount increases, the number of combinations of resistors and switching elements connected in parallel to a signal path increases, and a circuit surface area increases.

The present invention has been made in view of the above-described circumstances and an object thereof is to provide a high frequency variable attenuation circuit capable of reducing a circuit surface area.

A high frequency variable attenuation circuit according to an aspect of the present invention includes an input terminal, an output terminal, a first resistor having a first end connected to the input terminal, and a second end connected to a ground, a second resistor having a first end connected to the input terminal and the first end of the first resistor, and a second end connected to the output terminal, a third resistor having a first end connected to the second end of the second resistor and the output terminal, and a second end connected to the ground, and a first switching circuit having an output side resistor and an output side switching element that are connected in series to each other, in which the first switching circuit has a first circuit end connected to the second end of the second resistor and the output terminal, and a second circuit end connected to the ground.

According to this configuration, it is possible to obtain a circuit configuration in which the first switching circuit is connected only to an output side of a π-type attenuation circuit constituted by a combined resistance of the first resistor, the second resistor, the third resistor, and the output side resistor. Therefore, without providing a switching circuit on any side (for example, an input side) besides the output side of the π-type attenuation circuit, it is possible to simplify a circuit configuration of the high frequency variable attenuation circuit. In other words, over the entirety of the high frequency variable attenuation circuit, it is possible to decrease the number of the switching elements constituting the switching circuit, and it is possible to make a circuit surface area smaller than a circuit surface area of a conventional configuration.

The high frequency variable attenuation circuit according to the aspect of the present invention may include a second switching circuit connected in parallel to the second resistor, and the second switching circuit may have a bypass switching element.

According to this configuration, depending on the operation state of the bypass switching element, it is possible to switch between a bypass mode where a high frequency signal flows to the second switching circuit, and a signal attenuation mode where the high frequency signal flows to the second resistor without having the high frequency signal flow to the second switching circuit. In other words, in the attenuation circuit constituted by the first resistor, the second resistor, and the third resistor, it is possible to switch an ON/OFF state of the function of the attenuation circuit.

Also, according to this configuration, the number of the switching elements is one, which is less than the number of switching elements in a conventional configuration. Therefore, it is possible to keep the parasitic capacitance of the switching element to a minimum. Therefore, it is possible to suppress the occurrence of failures in impedance matching.

In the high frequency variable attenuation circuit according to the aspect of the present invention, the second switching circuit may have a bypass resistor connected in series to the bypass switching element.

According to this configuration, in a mode where the high frequency signal flows to the second switching circuit, it is possible to have the high frequency signal flow to the bypass resistor. Therefore, even in a case where the high frequency signal flows to the second switching circuit, it is possible to obtain an attenuation effect of the high frequency signal.

In the high frequency variable attenuation circuit according to the aspect of the present invention, layout shapes of the first resistor, the second resistor, the third resistor, and the output side resistor may be the same as each other.

With respect to the layout of the plurality of the resistors provided in the high frequency variable attenuation circuit, the plurality of resistors having the same layout shape are connected in series or in parallel. Therefore, in a configuration in which the layout shapes of the first resistor, the second resistor, the third resistor, and the output side resistor are the same as each other, even if variations in the resistance values between the resistors are generated by a process of mass producing the resistors, the tendency of generated variations is mutually equal or similar. Due to this, the attenuation amount, which is determined by the relative ratio of series resistance values in a signal path and parallel resistance values in a signal path, is less affected by the variations generated by the production process.

In the high frequency variable attenuation circuit according to the aspect of the present invention, a resistance value of the third resistor may be different from a resistance value of the output side resistor.

According to this configuration, it is possible to select an appropriate resistance value for each of the third resistor and the output side resistor. By selecting appropriate resistance values, it is possible to meet the dynamic range of the required attenuation amount.

According to the above aspect of the present invention, it is possible to provide a high frequency variable attenuation circuit capable of reducing a circuit surface area.

PREFERRED EMBODIMENTS

Figure 1:
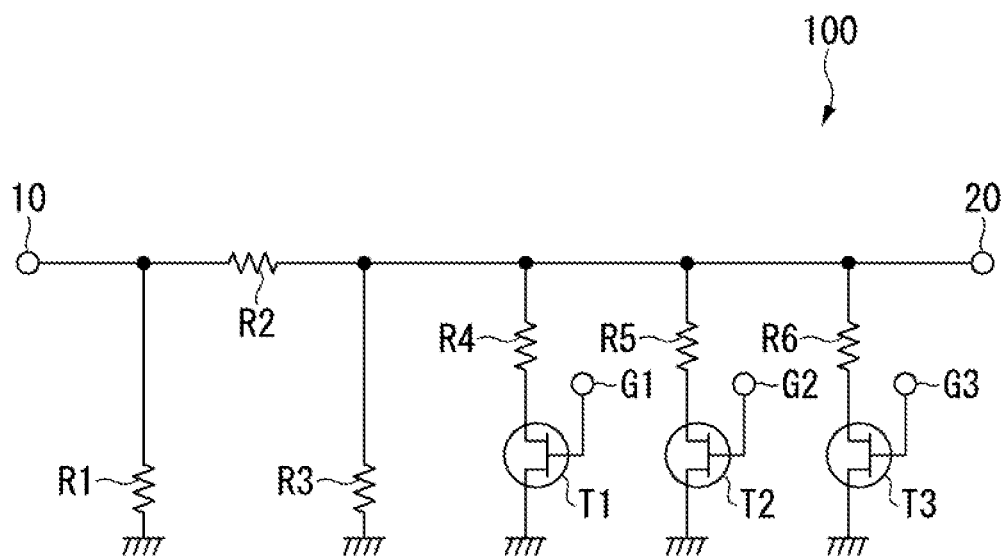
FIG. 1 is a circuit diagram showing a configuration of a high frequency variable attenuation circuit according to a first embodiment of the present invention.

High frequency variable attenuation circuits according to embodiments of the present invention will be described with reference to the drawings.

In the description of the embodiments, configurations containing equal or similar functions have the same reference numerals and signs. Redundant explanations of such configurations may be omitted.

As for how ends of resistors constituting the high frequency variable attenuation circuit are referred to, the wording a "first end" may be rephrased as "one end", and the wording a "second end" may be rephrased as "the other end". The second end is located opposite the first end.

First Embodiment

<High Frequency Variable Attenuation Circuit 100>

A high frequency variable attenuation circuit 100 shown in FIG. 1 includes an input terminal 10, an output terminal 20, a first resistor R1, a second resistor R2, a third resistor R3, output side resistors R4, R5, and R6, and output side switching elements T1, T2, and T3.

In the explanation below, the first resistor R1, the second resistor R2, and the third resistor R3 may simply be referred to as resistors R1, R2 and R3.

In the present embodiment, the number of the output side resistors and the number of the output side switching elements are, for example, three. The number of the output side resistors and the number of the output side switching elements are not limited to three, and may be any arbitrary number greater than or equal to one.

<Input Terminal 10>

The input terminal 10 is a terminal to which a high frequency signal is input from the outside of the high frequency variable attenuation circuit 100.

In the present embodiment, the high frequency signal is a signal having a frequency wave band of, for example, several tens of GHz.

<Output Terminal 20>

The output terminal 20 is a terminal that outputs a high frequency signal attenuated by the high frequency variable attenuation circuit 100 to another circuit of a chip or the like. A first switching circuit, to be mentioned later on, is provided between the input terminal 10 and the output terminal 20. It is possible to change the attenuation amount of the high frequency signal input to the input terminal 10 by multiple of levels by the first switching circuit.

<Resistors R1, R2, and R3>

The resistors R1, R2, and R3 form a π-type attenuation circuit. The resistors R1, R2, and R3 form a circuit to perform impedance matching.

It is possible to set resistance values of the resistors R1, R2, and R3 to correspond to the design of the π-type attenuation circuit. For example, in a case where the resistance value of the resistor R1 is set to 50 Ohm, it is possible to select a combination of the resistance values of the resistors R2 and R3 that allow impedance matching on the input side.

A first end of the first resistor R1 is connected to the input terminal 10 and a first end of the second resistor R2.

A second end of the first resistor R1 is connected to a ground.

The first end of the second resistor R2 is connected to the input terminal 10 and the first end of the first resistor R1.

A second end of the second resistor R2 is connected to the output terminal 20, a first end of the third resistor R3, a first end of the output side resistor R4, a first end of the output side resistor 125, and a first end of the output side resistor R6. In other words, the second end of the second resistor R2 is connected to a first circuit end of the first switching circuit. The second resistor R2 is disposed between the input terminal 10 and the output terminal 20.

The first end of the third resistor R3 is connected to the second end of the second resistor R2 and the output terminal 20. In other words, the first end of the third resistor R3 is connected to the first circuit end of the first switching circuit.

A second end of the third resistor R3 is connected to the ground.

Configurations of the resistors R1, R2, and R3 are not particularly limited. It is possible to use commonly known resistors as the resistors R1, R2, and R3.

<Output Side Resistors R4, R5, and R6>

The first end of the output side resistor R4 is connected to the second end of the second resistor R2, the first end of the third resistor R3, the first end of the output side resistor R5, the first end of the output side resistor R6, and the output terminal 20. The first end of the output side resistor R4 is equivalent to the first circuit end of the first switching circuit including the output side resistor R4.

A second end of the output side resistor R4 is connected to a first terminal of the output side switching element T1.

The first end of the output side resistor R5 is connected to the second end of the second resistor R2, the first end of the third resistor R3, the first end of the output side resistor R4, the first end of the output side resistor R6, and the output terminal 20. The first end of the output side resistor R5 is equivalent to the first circuit end of the first switching circuit including the output side resistor R5.

A second end of the output side resistor R5 is connected to a first terminal of the output side switching element T2.

The first end of the output side resistor R6 is connected to the second end of the second resistor R2, the first end of the third resistor R3, the first end of the output side resistor R4, the first end of the output side resistor R5, and the output terminal 20. The first end of the output side resistor R6 is equivalent to the first circuit end of the first switching circuit including the output side resistor R6.

A second end of the output side resistor R6 is connected to a first terminal of the output side switching element T3.

Configurations of the output side resistors R4, R5, and R6 are not particularly limited. It is possible to use commonly known resistors as the output side resistors R4, R5, and R6.

The resistance value of the third resistor R3 is different from a resistance value of each of the output side resistors R4, R5, and R6. From this, it is possible to select appropriate resistance values for each of the third resistor R3 and the output side resistors R4, R5, and R6. By selecting appropriate resistance values, it is possible to meet the dynamic range of the required attenuation amount.

The resistors R1, R2, and R3 and the output side resistors R4, R5, and R6 are configured from an arbitrarily selected combination of unit resistive elements having the same size and the same shape. From this, it is possible to minimize the variations in resistance values of the resistors R1, R2, R3, R4, R5, and R6.

All of the resistors that are included in the π-type attenuation circuit and having fixed values have the same layout shape. The π-type attenuation circuit has a configuration in which the resistors mentioned above are connected in series or in parallel. In other words, the layout shapes of the resistors R1, R2 and R3 and the output side resistors R4, R5 and R6 are the same as each other.

The fixed value means a resistance value in a case where the plurality of unit resistive elements having the same layout shape are connected in series or in parallel. For example, in a case where two unit resistive elements each having a resistance value of 1 kOhm are connected in series, a resistance value (fixed value) of 2 kOhm is obtained. In a case where four unit resistive elements each having a resistance value of 1 kOhm are connected in parallel, a resistance value (fixed value) of 250 Ohm is obtained.

Here, regarding the phrase "the same layout shape" or the phrase "layout shapes are the same as each other", a case where lengths of rectangular resistive elements are the same and widths of the rectangular resistive elements are the same could be mentioned as a typical example.

<Output Side Switching Elements T1, T2 and T3>

Each of the output side switching elements T1, T2 and T3 is, for example, a transistor. The type of the transistor is not particularly limited. For example, a bipolar transistor or a field effect transistor may be used as the output side switching element.

As for how the terminals of the switching elements constituting the high frequency variable attenuation circuit are referred to, a source terminal may be rephrased as a "first terminal" and a drain terminal may be rephrased as a "second terminal". Alternatively, the drain terminal may be rephrased as the "first terminal", and in this case, the source terminal may be rephrased as the "second terminal". A gate terminal may be rephrased as a "third terminal". The gate terminal is a terminal to which a switching signal is input. The switching signal is a signal for switching an electrical connection state between the source terminal and the drain terminal to an open state or a closed state.

The first terminal of the output side switching element T1 is connected to the second end of the output side resistor R4.

A second terminal of the output side switching element T1 is connected to the ground. In other words, the second terminal of the output side switching element T1 is equivalent to a second circuit end of the first switching circuit including the output side switching element T1.

A third terminal of the output side switching element T1 is connected to a gate input terminal G1.

In the output side switching element T1, when a gate signal is input to the gate input terminal G1, a voltage is applied to the third terminal, and the output side switching element T1 operates (in an ON state). When the output side switching element T1 operates, the electrical connection state between the first terminal and the second terminal is in a closed state. On the other hand, when no gate signal is input to the gate input terminal G1, no voltage is applied to the third terminal, and the output side switching element T1 does not operate (in an OFF state). Since the output side switching element T1 does not operate, the electrical connection state between the first terminal and the second terminal is in an open state.

The first terminal of the output side switching element T2 is connected to the second end of the output side resistor R5.

A second terminal of the output side switching element 12 is connected to the ground. In other words, the second terminal of the output side switching element T2 is equivalent to the second circuit end of the first switching circuit including the output side switching element T2.

A third terminal of the output side switching element T2 is connected to a gate input terminal G2.

An ON state or OFF state in the output side switching element T2 is controlled by whether or not a gate signal is input to the gate input terminal G2. Since the operation of the output side switching element T2 is similar to the operation of the output side switching element T1, the explanation thereof is omitted.

The first terminal of the output side switching element T3 is connected to the second end of the output side resistor R6.

A second terminal of the output side switching element 13 is connected to the ground. In other words, the second terminal of the output side switching element n is equivalent to the second circuit end of the first switching circuit including the output side switching element T3.

A third terminal of the output side switching element T3 is connected to a gate input terminal G3.

An ON state or OFF state in the output side switching element T3 is controlled by whether or not a gate signal is input to the gate input terminal G3. Since the operation of the output side switching element T3 is similar to the operation of the output side switching element in, the explanation thereof is omitted.

<First Switching Circuit>

The output side resistor R4 and the output side switching element T1 are connected in series to each other, and form one switching circuit. Similarly, the output side resistor R5 and the output side switching element T2 are connected in series to each other, and form one switching circuit. The output side resistor R6 and the output side switching element T3 are connected in series to each other, and form one switching circuit.

The switching circuit having the output side resistor and the output side switching element connected in series to each other in this manner is an example of the first switching circuit. In other words, the first switching circuit is connected between the second resistor R2, the output terminal 20, and the ground. The first switching circuit may also be referred to as a first series switching circuit.

In the present embodiment, the number of the first switching circuits is three. The number of the first switching circuits is not limited to three, and may be any arbitrary number greater than or equal to one.

No switching circuit is provided between the input terminal 10 and the first resistor R1, that is, on the input side in the high frequency variable attenuation circuit 100.

On the other hand, the first switching circuits mentioned above are provided between the output terminal 20 and the third resistor R3, that is, on the output side in the high frequency variable attenuation circuit 100. It is possible to change the attenuation amount of the high frequency variable attenuation circuit 100 by changing the resistance (resistance value) on the output side, as is mentioned later on.

<Control of Attenuation Amount of High Frequency Signal>

The attenuation amount of the high frequency signal is controlled by the presence or lack of a gate signal input to each of the gate input terminals G1 to G3.

For example, in a case where a gate signal is not provided to any of the gate input terminals G1 to G3, the high frequency signal input to the high frequency variable attenuation circuit 100 is attenuated by the π-type attenuation circuit in which the resistance circuit on the output side is constituted only by the third resistor R3.

In a case where, out of the gate input terminals G1 to G3, a gate signal is provided only to the gate input terminal G1, the high frequency signal input to the high frequency variable attenuation circuit 100 is attenuated by the π-type attenuation circuit in which the resistance circuit on the output side is constituted by a combined parallel resistance of the third resistor R3 and the output side resistor R4.

In a case where, out of the gate input terminals G1 to G3, a gate signal is provided to the gate input terminals G1 and G2, the high frequency signal input to the high frequency variable attenuation circuit 100 is attenuated by the π-type attenuation circuit in which the resistance circuit on the output side is constituted by a combined parallel resistance of the third resistor R3, the output side resistor R4, and the output side resistor R5.

In a case where a gate signal is provided to all of the gate input terminals G1 to G3, the high frequency signal input to the high frequency variable attenuation circuit 100 is attenuated by the π-type attenuation circuit in which the resistance circuit on the output side is constituted by a combined parallel resistance of the third resistor R3, the output side resistor R4, the output side resistor R1, and the output side resistor R6.

Therefore, it is possible to control the attenuation amount of the high frequency signal by the three first switching circuits. Particularly, it is possible to control the attenuation amount of the high frequency signal by the combination of the resistors forming the first switching circuits.

In other words, the first switching circuit in which the output side resistor and the output side switching element are connected in series to each other is disposed between the third resistor R3 and the output terminal 20. The first switching circuit is connected in parallel to the third resistor R3. In the present embodiment, there are three first switching circuits. It is possible to control an ON/OFF state of the output side switching elements T1 to T3 by whether or not a gate signal is input to the gate input terminals G1 to G3, and thereby it is possible to select the resistance value of the combination of the three first switching circuits.

For example, in a case where the number of the first switching circuits is N, $2^N$ combinations of the first switching circuits can be obtained, and it is possible to select the attenuation amount according to the combined resistance of the combination of the first switching circuits.

According to the above mentioned high frequency variable attenuation circuit 100, the three first switching circuits are connected only to the output side of the π-type attenuation circuit. Therefore, without providing a switching circuit on the input side of the π-type attenuation circuit, it is possible to simplify the circuit configuration of the high frequency variable attenuation circuit 100. In other words, over the entirety of the high frequency variable attenuation circuit 100, it is possible to decrease the number of the switching elements constituting the switching circuits, and it is possible to keep the parasitic capacitance of the switching elements to a minimum. Therefore, it is possible to suppress the occurrence of failures in impedance matching.

Further, since a switching circuit need not be provided on the input side of the π-type attenuation circuit, it is possible to make the circuit surface area smaller than the circuit surface area of a conventional configuration.

With respect to the layout of the plurality of the resistors R1, R2, R3, R4, R5 and R6 provided in the high frequency variable attenuation circuit 100, the plurality of resistors having the same layout shape are connected in series or in parallel. For this reason, even if variations in the resistance values between the resistors are generated by a process of mass producing the resistors, the tendency of generated variations is mutually equal or similar. Due to this, the attenuation amount, which is determined by the relative ratio of series resistance values in a signal path and parallel resistance values in a signal path, is less affected by the variations generated by the production process.

First Modification Example of First Embodiment

In the circuit configuration shown in FIG. 1, the output terminal 20 is connected to the first ends of the output side resistors (R4, R5, R6), and the first terminals of the output side switching elements (T1, T2, T3) are connected to the second ends of the output side resistors (R4, R5, R6), respectively. In this configuration, the second terminals of the output side switching elements (T1, T2, T3) are connected to the ground.

As a first modification example of the first embodiment, a configuration in which the position of the output side resistors and the position of the output side switching elements are reversed may be adopted.

Specifically, the output terminal 20 may be connected to the first terminals of the output side switching elements (T1, T2, T3), the first ends of the output side resistors (R4, R5, R6) may be connected to the second terminals of the output side switching elements (T1, T2, T3), respectively, and the second ends of the output side resistors (R4, R5, R6) may be connected to the ground.

Second Modification Example of First Embodiment

In the circuit configuration shown in FIG. 1, the third resistor R3, the output side resistor R4, the output side resistor R5, and the output side resistor R6 are arranged in this order in a direction towards the output terminal 20 from the input terminal 10. However, the order in which the plurality of resistors are arranged is not limited to the example shown in FIG. 1.

For example, the plurality of resistors may be arranged so that the third resistor R3 is disposed between the output side resistor R4 and the output side resistor R5. In other words, the order in which the third resistor R3, the output side resistor R4, the output side resistor R5, and the output side resistor R6 are arranged in a direction towards the output terminal 20 from the input terminal 10 is interchangeable.

Second Embodiment

<High Frequency Variable Attenuation Circuit 200>

A high frequency variable attenuation circuit 200 according to a second embodiment will be described with reference to FIG. 2.

The second embodiment differs from the first embodiment in that a second switching circuit is provided.

Figure 2:
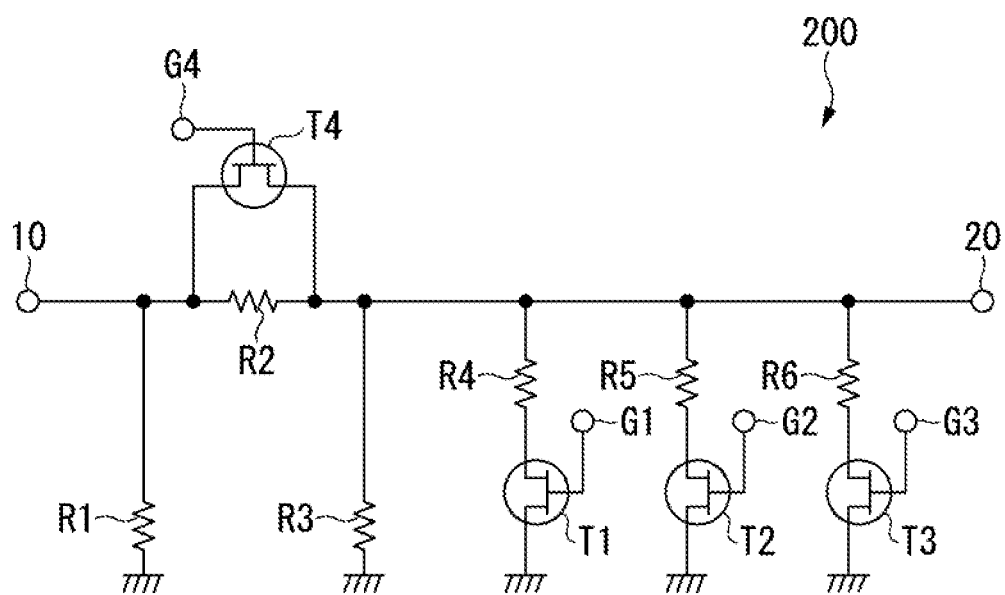
FIG. 2 is a circuit diagram showing a configuration of a high frequency variable attenuation circuit according to a second embodiment of the present invention.

In FIG. 2, components the same as those in the first embodiment will be, denoted by the same reference numerals and signs, and description thereof will be omitted or simplified.

<Second Switching Circuit>

The second switching circuit has a bypass switching element T4 shown in FIG. 2. The second switching circuit is connected in parallel to the second resistor R2. In the present embodiment, the number of the second switching circuits is one.

<Bypass Switching Element T4>

The bypass switching element T4 is, for example, a transistor, similar to the output side switching element mentioned above.

A first terminal of the bypass switching element T4 is connected to the input terminal 10, the first end of the first resistor R1, and the first end of the second resistor R2.

A second terminal of the bypass switching element T4 is connected to the second end of the second resistor R2, the output terminal 20, the first end of the third resistor R3, the first end of the output side resistor R4, the first end of the output side resistor R5, and the first end of the output side resistor R6.

A third terminal of the bypass switching element T4 is connected to a gate input terminal G4.

In the bypass switching element T4, when a gate signal is input to the gate input terminal G4, a voltage is applied to the third terminal, and the bypass switching element T4 operates (in an ON state). When the bypass switching element T4 operates, the electrical connection state between the first terminal and the second terminal is in a closed state. On the other hand, when no gate signal is input to the gate input terminal G4, no voltage is applied to the third terminal, and the bypass switching element T4 does not operate (in an OFF state). Since the bypass switching element T4 does not operate, the electrical connection state between the first terminal and the second terminal is in an open state.

The bypass switching element T4 is a switching element that switches between whether the high frequency signal is to be attenuated by the second resistor R2 or not.

In a case where the bypass switching element T4 is in an ON state, the high frequency signal input to the input terminal 10 flows to the first terminal and the second terminal of the bypass switching element T4, and flows towards the output terminal 20. In other words, the high frequency signal hardly flows to the second resistor R2. That is, it is possible to reduce the attenuation amount of the high frequency signal.

In a case where the bypass switching element T4 is in an OFF state, the high frequency signal input to the input terminal 10 does not pass through to the first terminal and the second terminal of the bypass switching element T4, but flows to the second resistor R2, and flows towards the output terminal 20. For this reason, the high frequency signal is attenuated by the π-type attenuation circuit constituted by the resistance circuit on the output side that includes the first resistor R1, the second resistor R2, and the third resistor R3. That is, compared to the case where the bypass switching element T4 is in an ON state, it is possible to make the attenuation amount of the high frequency signal larger in the case where the bypass switching element T4 is in an OFF state.

In the high frequency variable attenuation circuit 200 having such a configuration, by switching the operation state of the bypass switching element T4 between an ON or OFF state, it is possible to select a small attenuation mode where the attenuation amount of the high frequency signal is small, and a large attenuation mode where the attenuation amount of the high frequency signal is large. For example, in a case where a high frequency signal is not to be largely attenuated, by having the bypass switching element T4 be in an ON state, it is possible not to have the high frequency signal flow to the second resistor R2.

In other words, depending on the operation state of the bypass switching element T4, it is possible to switch between a bypass mode where the high frequency signal flows to the second switching circuit, and a signal attenuation mode where the high frequency signal flows to the second resistor R2 without having the high frequency signal flow to the second switching circuit. That is, it is possible to switch an ON/OFF state of the function of the attenuation circuit in the high frequency variable attenuation circuit 200.

Therefore, even in a case where the amplitude of the high frequency signal input to the input terminal 10 is large, or in a case where the amplitude is small, it is possible to attain an attenuation circuit that is compatible with the input high frequency signal. In other words, it is possible to attain an attenuation circuit that is capable of standardizing output.

Third Embodiment

<High Frequency Variable Attenuation Circuit 300>

A high frequency variable attenuation circuit 300 according to a third embodiment will be described with reference to FIG. 3.

The third embodiment differs from the second embodiment in that the second switching circuit has a bypass resistor.

Figure 3:
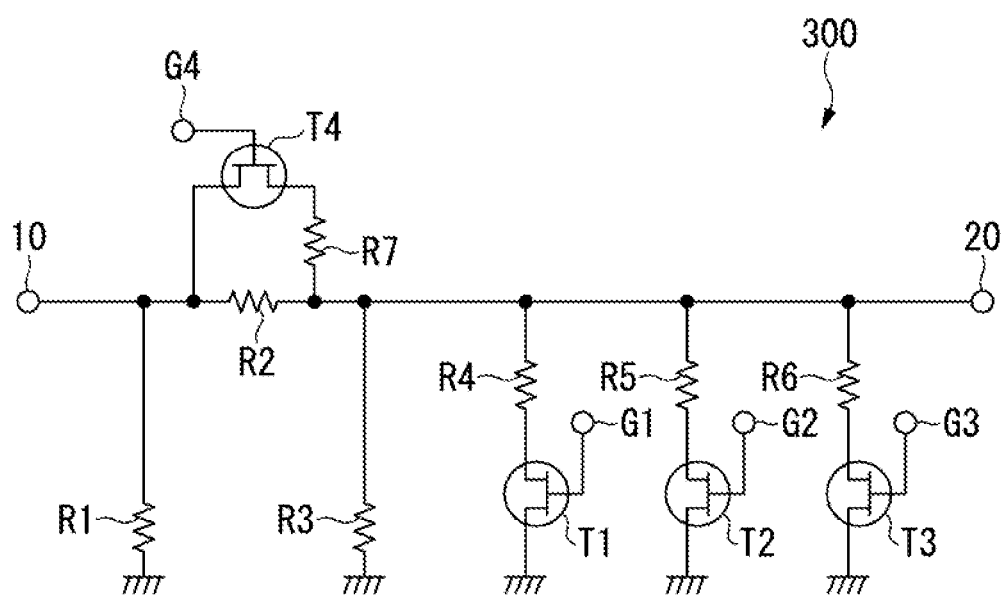
FIG. 3 is a circuit diagram showing a configuration of a high frequency variable attenuation circuit according to a third embodiment of the present invention.

In FIG. 3, components the same as those in the first embodiment and the second embodiment will be denoted by the same reference numerals and signs, and description thereof will be omitted or simplified.

<Bypass Resistor R7>

The second switching circuit has a bypass resistor R7 connected in series to the bypass switching element T4.

A first end of the bypass resistor R7 is connected to the second terminal of the bypass switching element T4.

A second end of the bypass resistor R7 is connected to the second end of the second resistor R2, the output terminal 20, the first end of the third resistor R3, the first end of the output side resistor R4, the first end of the output side resistor R5, and the first end of the output side resistor R6.

In a case where the bypass switching element T4 is in an ON state, the high frequency signal input to the input terminal 10 flows to the first terminal and the second terminal of the bypass switching element T4, flows also to the bypass resistor R7, and flows towards the output terminal 20. In other words, the high frequency signal flows through the combined resistance of the second resistor R2 and the bypass resistor R7 connected in parallel to each other.

In a case where the bypass switching element T4 is in an OFF state, the high frequency signal input to the input terminal 10 does not pass through the first terminal and the second terminal of the bypass switching element T4, but flows to the second resistor R2, and flows towards the output terminal 20. For this reason, the high frequency signal almost entirely flows only to the second resistor R2. That is, compared to the case where the bypass switching element T4 is in an ON state, it is possible to make the attenuation amount of the high frequency signal larger in the case where the bypass switching element T4 is in an OFF state.

In the high frequency variable attenuation circuit 300 having such a configuration, by switching the operation state of the bypass switching element T4 between an ON or OFF state, it is possible to select a small attenuation mode where the attenuation amount of the high frequency signal is small, and a large attenuation mode where the attenuation amount of the high frequency signal is large.

By means of the combined resistance obtained by the parallel connection between the second resistor R2 and the bypass resistor R7, it is possible to determine the attenuation amount in the small attenuation mode.

For example, in a case where the attenuation amount is adjusted so as not to largely attenuate the high frequency signal, the value of the combined resistance obtained by the above parallel connection may be adjusted by making the bypass switching element T4 be in an ON state.

Similar to the second embodiment, it is possible to switch the attenuation amount in the high frequency variable attenuation circuit 300.

Therefore, in a case where the decibel value of the high frequency signal input to the input terminal 10 is large, or in a case where the decibel value is small, it is possible to attain an attenuation circuit that is compatible with the input high frequency signal. In other words, it is possible to attain an attenuation circuit that is capable of standardizing output.

Modification Example of Third Embodiment

In the circuit configuration shown in FIG. 3, the first end of the bypass resistor R7 is connected to the second terminal of the bypass switching element T4, and the second end of the bypass resistor R7 is connected to the output terminal 20.

As a modification example of the third embodiment, a configuration in which the position of the bypass resistor R7 and the position of the bypass switching element T4 are reversed may be adopted.

Specifically, the first end of the bypass resistor R7 may be connected to the input terminal 10, the first end of the first resistor R1, and the first end of the second resistor R2. In this case, the second end of the bypass resistor R7 is connected to the first terminal of the bypass switching element T4.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A high frequency variable attenuation circuit comprising:
   an input terminal;
   an output terminal;
   a first resistor having a first end connected to the input terminal, and a second end connected to a ground;
   a second resistor having a first end connected to the input terminal and the first end of the first resistor, and a second end connected to the output terminal;
   a third resistor having a first end connected to the second end of the second resistor and the output terminal, and a second end connected to the ground; and
   a first switching circuit having an output side resistor and an output side switching element that are connected in series to each other,
   wherein the first switching circuit has a first circuit end connected to the second end of the second resistor and the output terminal, and a second circuit end connected to the ground, and
   layout shapes of the first resistor, the second resistor, the third resistor, and the output side resistor are the same as each other.

2. The high frequency variable attenuation circuit according to claim 1, further comprising:
   a second switching circuit connected in parallel to the second resistor,
   wherein the second switching circuit has a bypass switching element.

3. The high frequency variable attenuation circuit according to claim 2, wherein the second switching circuit has a bypass resistor connected in series to the bypass switching element.

4. The high frequency variable attenuation circuit according to claim 1, wherein a resistance value of the third resistor is different from a resistance value of the output side resistor.

5. The high frequency variable attenuation circuit according to claim 1, wherein the first resistor, the second resistor, the third resistor, and the output side resistor are configured from a combination of unit resistive elements having the same size and the same shape.

6. The high frequency variable attenuation circuit according to claim 1, wherein the first switching circuit is disposed between the third resistor and the output terminal.

* * * * *